(12) United States Patent
Kim

(10) Patent No.: US 11,481,054 B2
(45) Date of Patent: Oct. 25, 2022

(54) DISPLAY DEVICE

(71) Applicant: Samsung Display Co., LTD., Yongin-si (KR)

(72) Inventor: Min Soo Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 7 days.

(21) Appl. No.: 16/809,188

(22) Filed: Mar. 4, 2020

(65) Prior Publication Data

US 2020/0379595 A1 Dec. 3, 2020

(30) Foreign Application Priority Data

May 31, 2019 (KR) .................. 10-2019-0064347

(51) Int. Cl.
*G09G 3/32* (2016.01)
*G06F 3/041* (2006.01)
*H01L 27/32* (2006.01)
*G06F 1/16* (2006.01)

(52) U.S. Cl.
CPC .......... *G06F 3/0412* (2013.01); *G06F 1/1652* (2013.01); *G09G 3/32* (2013.01); *H01L 27/3276* (2013.01); *G09G 2330/04* (2013.01)

(58) Field of Classification Search
CPC ......... G06F 1/1652; G06F 2203/04102; G06F 3/0412; G06F 2203/04112; G06F 3/0443; G06F 3/0446; G06F 1/1637; G09G 3/035; G09G 2330/12; G09G 3/32; G09G 2330/04; G09G 2300/0426; G09G 2380/02; G09G 3/3208; G09G 3/03; H01L 27/3276; H01L 51/0031; H01L 27/323; H01L 27/3225; H01L 51/0097; H01L 2251/5338; H01L 51/52; H04M 1/0266; H04M 1/0268; H04M 1/0269; G01N 27/045; G01N 27/041; G01N 21/95; G09F 9/301
See application file for complete search history.

(56) References Cited

U.S. PATENT DOCUMENTS

| 9,430,180 | B2 | 8/2016 | Hirakata |
| 9,535,522 | B2 | 1/2017 | Ahn |
| 2006/0246360 | A1* | 11/2006 | Hwang ............ H01L 29/78633 430/5 |
| 2014/0176844 | A1* | 6/2014 | Yanagisawa ........... G09G 3/006 349/43 |
| 2015/0138041 | A1* | 5/2015 | Hirakata ............... G06F 1/1652 345/1.3 |

(Continued)

FOREIGN PATENT DOCUMENTS

| KR | 10-2016-0082883 | 7/2016 |
| KR | 10-2018-0065061 | 6/2018 |

(Continued)

*Primary Examiner* — Temesghen Ghebretinsae
*Assistant Examiner* — Karin Kiyabu
(74) *Attorney, Agent, or Firm* — Kile Park Reed & Houtteman PLLC

(57) ABSTRACT

A display device including a display panel that includes a display area including pixels and a non-display area around the display area. The display area may include a flat display area and at least one bending display area, and the display panel includes at least one crack detection line disposed in the at least one bending display area.

16 Claims, 10 Drawing Sheets

(56) References Cited

U.S. PATENT DOCUMENTS

| | | | |
|---|---|---|---|
| 2016/0179229 A1* | 6/2016 | Ahn | G06F 3/044 |
| | | | 345/173 |
| 2016/0307971 A1* | 10/2016 | Jeon | H01L 51/5246 |
| 2016/0351093 A1* | 12/2016 | Kim | G09G 3/2092 |
| 2017/0069239 A1* | 3/2017 | Kwon | H01L 27/124 |
| 2017/0345877 A1* | 11/2017 | Hwang | H01L 27/3276 |
| 2018/0350701 A1* | 12/2018 | Kim | H01L 22/34 |
| 2019/0157607 A1* | 5/2019 | Kim | H01L 51/5237 |

FOREIGN PATENT DOCUMENTS

| | | |
|---|---|---|
| KR | 10-2018-0131120 | 12/2018 |
| KR | 10-2019-0007570 | 1/2019 |
| KR | 10-2019-0009457 | 1/2019 |

* cited by examiner

DISPLAY DEVICE

CROSS-REFERENCE TO RELATED APPLICATION

This application claims priority to and the benefit of Korean Patent Application No. 10-2019-0064347 under 35 U.S.C. § 119, filed in the Korean Intellectual Property Office on May 31, 2019, the entire contents of which are incorporated herein by reference.

BACKGROUND

(a) Technical Field

This disclosure relates to a display device configured to enable detection of cracking among portions thereof.

(b) Description of the Related Art

A display device such as an organic light emitting diode display may include a display panel having a screen on which an image is displayed. The display panel may be manufactured by forming several layers and elements on a substrate.

Glass may be used as a substrate of the display panel. The glass substrate may be heavy and easily broken, and since the glass substrate may be rigid, it may be difficult to deform the display panel. Flexible display panels using a flexible substrate that is light, strong against impact, and easy to deform has been developed.

SUMMARY

The flexible display panel may include a bendable area. A crack may occur in the display panel in a case that the display panel may be bent. Moisture and the like may penetrate into the display panel, and a wire may be broken as a result of an occurrence of the crack, such that defects in the flexible display panel may be presented.

Embodiments provide a display device that may detect a crack that may occur in a display panel portion that may be a display area or a bending area of the display panel.

An embodiment may provide a display device including a display panel that includes a display area including pixels and a non-display area around the display area. The display area may include a flat display area and at least one bending display area. The display panel includes at least one crack detection line disposed in the at least one bending display area.

The display device may further include a crack detecting circuit portion disposed in the non-display area, and the at least one crack detection line may be electrically connected to the crack detecting circuit portion.

The flat display area may be rectangular, and the at least one bending display area may include four bending display areas respectively adjacent to four sides of the flat display area.

The at least one crack detection line may include a first crack detection line extending across three of the four bending display areas.

The display panel may include a pad portion disposed in the non-display area, and the at least one crack detection line may include a second crack detection line extending in a bending display area, among the four bending display areas, that is between the flat display area and the pad portion.

The display panel may include a substrate, light emitting diodes disposed on the substrate, an encapsulating layer covering the light emitting diodes, and a touch sensor unit disposed on the encapsulating layer. The touch sensor unit may include a first conductor, an insulating layer disposed on the first conductor, and a second conductor disposed on the insulating layer.

The first conductor may include the at least one crack detection line.

The first conductor may have a mesh shape, and the at least one crack detection line may extend in an alternating pattern along a line forming the mesh shape.

The at least one crack detection line may be offset from light emitting diodes.

The second conductor may include touch electrodes, and the first conductor may include a bridge electrically connecting adjacent ones of the touch electrodes.

The display panel may further include a buffer layer disposed between the encapsulating layer and the touch sensor unit, and the at least one crack detection line may be disposed between the encapsulating layer and the buffer layer.

The at least one crack detection line may be offset from the light emitting diodes.

The display panel may include a substrate, a transistor disposed on the substrate, and a light blocking layer disposed between the substrate and the transistor and overlapping a semiconductor layer of the transistor, and the at least one crack detection line may be disposed in a same layer as the light blocking layer and may be formed from a same material as the light blocking layer.

The display panel may further include a buffer layer disposed between the substrate and the transistor, and the at least one crack detection line may be disposed between the substrate and the buffer layer.

An embodiment may provide a display device including a display panel including a main panel area including a first side extending in a first direction and a second side extending in a second direction crossing the first direction, a first sub-panel area that may contact the first side and may be bent, and a second sub-panel area that may contact the second side and may be bent. The first sub-panel area and the second sub-panel area may include a display area and a non-display area, and the display panel may include a crack detection line disposed in the display area.

The display panel may include a substrate, a transistor disposed on the substrate, a light emitting diode disposed on the transistor, an encapsulating layer disposed on the light emitting diode, and a touch sensor unit disposed on the encapsulating layer, and the crack detection line may be disposed within the touch sensor unit.

The touch sensor unit may include a bridge disposed on the encapsulating layer, a first insulating layer disposed on the bridge, and touch electrodes disposed on the first insulating layer and electrically connected to each other by the bridge, and the crack detection line may be disposed in a same layer as the bridge and may be formed of a same material as the bridge.

The display panel may include a substrate, a transistor disposed on the substrate, a light emitting diode disposed on the transistor, an encapsulating layer disposed on the light emitting diode, a buffer layer disposed on the encapsulating layer, and a touch sensor unit disposed on the buffer layer, and the crack detection line may be disposed between the encapsulating layer and the buffer layer.

The display panel may include a substrate, a buffer layer disposed on the substrate, and a transistor disposed on the buffer layer, and the crack detection line may be disposed between the substrate and the buffer layer.

The display panel may include a light blocking layer disposed between the substrate and the buffer layer and overlapping a semiconductor layer of the transistor, and the crack detection line may be formed of a same material as the light blocking layer.

According to the embodiments, it may be possible to detect a crack occurring in a display panel, including in a bended display area, thereby preventing an occurrence of defects in a display device, and thus increasing reliability of the display device.

DETAILED DESCRIPTION OF THE EMBODIMENTS

Figure 1:
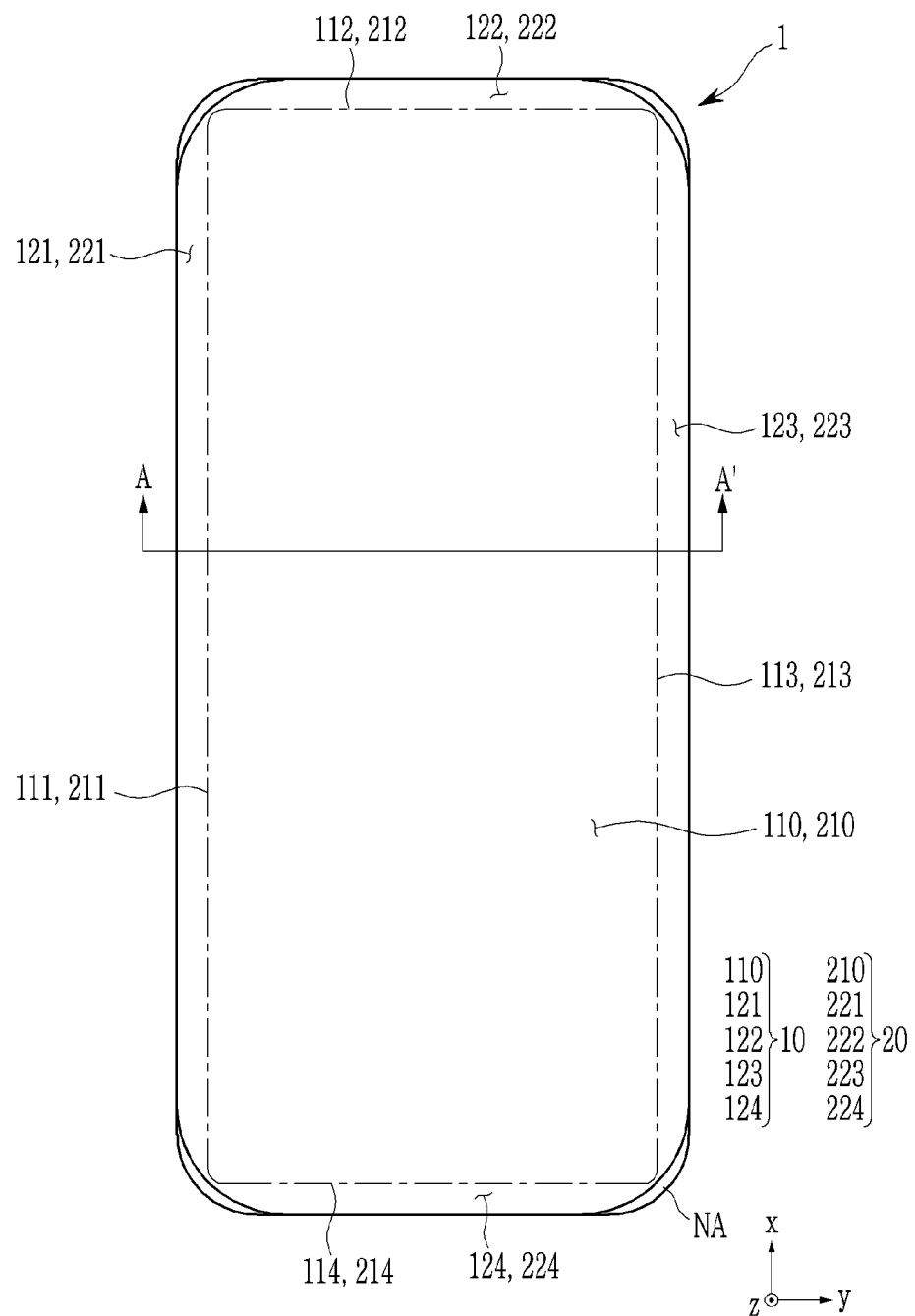
FIG. 1 illustrates a front view of a display device according to an embodiment.

The disclosure will be described more fully hereinafter with reference to the accompanying drawings. As those skilled in the art would realize, the described embodiments may be modified in various different ways, all without departing from the spirit or scope of the disclosure.

Parts that are irrelevant to the description will be omitted to clearly describe the disclosure, and like reference numerals designate like elements throughout the specification.

Further, in the drawings, the size and thickness of each element may be arbitrarily illustrated for ease of description, but the disclosure may not be necessarily limited to those embodiments illustrated in the drawings. In the drawings, the thicknesses of layers, films, panels, regions, etc., may be exaggerated for clarity.

It will be understood that when an element such as a layer, film, region, or substrate is referred to as being "on" another element, it may be directly on the other element or intervening elements may also be present. In contrast, when an element is referred to as being "directly on" another element, there may be no intervening elements present. The word "over" or "on" means positioning on or below an object portion, and does not necessarily mean positioning on the upper side of the object portion based on a gravity direction.

Unless explicitly described to the contrary, the word "comprise" and variations such as "comprises" or "comprising" will be understood to imply the inclusion of stated elements but not the exclusion of any other elements. As used herein, the term "and/or" may include any and all combinations of one or more of the associated listed items.

Expressions such as "at least one of," when preceding a list of elements, modify the entire list of elements and do not modify the individual elements of the list. As used herein, the term "and/or" may include any and all combinations of one or more of the associated listed items. Expressions such as "at least one of," when preceding a list of elements, modify the entire list of elements and do not modify the individual elements of the list.

In a case that a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

It will be understood that the terms "first," "second," etc. may be used herein to describe various components, these components should not be limited by these terms. These terms may only be used to distinguish one component from another.

As used herein, the singular forms "a," "an," and "the" are intended to include the plural forms as well, unless the context clearly indicates otherwise.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it may be directly or indirectly in contact with or electrically connected to the other element, area, or layer.

Further, the phrase "in a plan view" means when an object portion is viewed from above, and the phrase "in a cross-sectional view" means when a cross-section taken by vertically cutting an element portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

In the drawings, and with respect to referenced directions, 'x' may be a first direction, 'y' may be a second direction perpendicular to the first direction, and z may be a third direction perpendicular to the first direction and the second direction.

Figure 2:
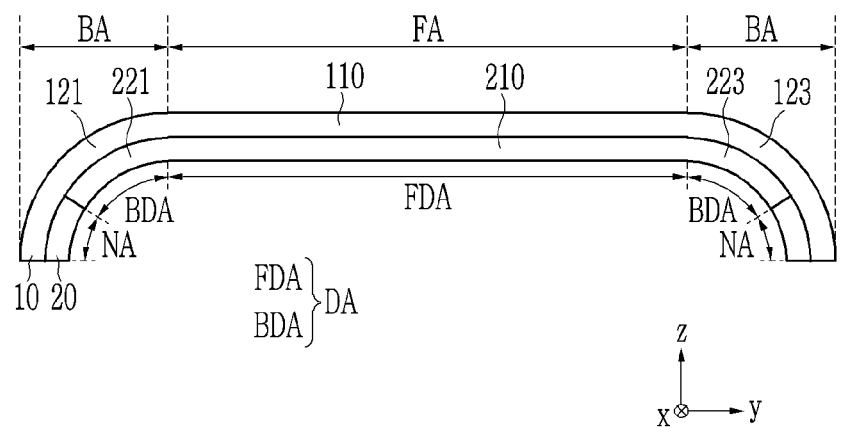
FIG. 2 illustrates a schematic cross-sectional view taken along line A-A' in FIG. 1.

FIG. 1 illustrates a front view of a display device 1 according to an embodiment, and FIG. 2 illustrates a schematic cross-sectional view taken along line A-A' in FIG. 1.

Referring to FIG. 1 and FIG. 2, the display device 1 may include a window 10 and a display panel 20 disposed on a rear surface of the window 10. The display device 1 may be an electronic device such as a smart phone, a mobile phone, a tablet, a multimedia player, or a portable information terminal, or a module used in the electronic device. Four edge areas of each of the window 10 and the display panel 20 may be bent. In another example, one or two of the four edge areas of each of the window 10 and the display panel 20 may not be bent.

The window 10 may be embodied as a cover that may protect the display panel 20 from an external environment, an impact, and the like. The window 10 may support maintenance of a bending state of the display panel 20. The window 10 may be made of a transparent and rigid material such as glass or plastic so that an image displayed on a screen of the display panel 20 may be viewed. The window 10 may be bent by thermoforming a glass plate, a plastic plate, or the like.

The display panel 20 may be a light emitting display panel including light emitting elements. At least a portion of the display panel 20 may be flexible. The display panel 20 may mainly include a display area DA corresponding to a screen on which an image may be displayed, and a non-display area NA on which an image may not be displayed. Pixels may be arranged in the display area, and an image may be displayed by a combination of the pixels. Signal lines for transmitting signals for driving the pixels may be arranged in the display area. For example, data lines transmitting data signals may extend in a first direction x, and gate lines transmitting gate signals may extend in a second direction y. Each pixel may be connected to a transistor connected to the data line and the gate line, and the pixel may receive a data signal (voltage) for controlling brightness of the pixel at a predetermined timing.

The non-display area NA may be disposed near an edge of the display panel 20 and may surround or be around a periphery of the display area. The non-display area NA may be an area in which circuits and/or wires for generating and/or transmitting various signals applied to the display area may be disposed. The non-display area NA may be provided with a pad portion including pads for receiving signals from an outside of the display panel 20 or for outputting signals to the outside of the display panel 20. The pad portion may be disposed in the non-display area NA at an upper or lower edge of the display panel 20, and a flexible printed circuit film may be bonded to the pad portion.

Since four edge areas of the display panel 20 may be bent, the non-display area NA may be hardly visible when the display device 1 is viewed from the front. As a result that the four edge areas of the display panel 20 may be bent, the screen may occupy most of an area viewed when the display device 1 may be viewed from the front, thus a screen-to-body ratio of the display device 1 may be maximized.

In the display device 1, the window 10 and the display panel 20 may be bent and attached together. An adhesive such as an optically clear adhesive may be used for adhesion between the window 10 and the display panel 20, and the adhesive layer may be disposed between the window 10 and the display panel 20

In a case that the window 10 may be divided into portions, the window 10 may include a substantially flat main window portion 110, and a first sub-window portion 121, a second sub-window portion 122, a third sub-window portion 123, and a fourth sub-window portion 124 which may be disposed to contact the main window portion 110.

The main window portion 110 may be substantially rectangular and may include four sides 111 to 114. In the main window portion 110, edges of corner portions thereof may be rounded. A first side 111 and a third side 113 may extend in the first direction x, and a second side 112 and a fourth side 114 may extend in the second direction y. The first to fourth sub-window portions 121 to 124 may be portions that may be bent at a predetermined curvature with respect to the main window portion 110. The first to fourth sides 111 to 114 of the main window portion 110 may represent reference lines for bending the first to fourth sub-window portions 121 to 124 with respect to the main window portion 110. The first to fourth sides 111 to 114 of the main window portion 110 may represent bending start lines of the first to fourth sub-window portions 121 to 124. In other words, the first to fourth sides 111 to 114 of the main window portion 110 may be start lines from which bending of the first to fourth sub-window portions 121 to 124 may be initiated.

Similar to the window 10, the display panel 20 may include a substantially flat main panel area 210, and a first sub-panel area 221, a second sub-panel area 222, a third sub-panel area 223, and a fourth sub-panel area 224 that may be disposed to contact the main panel area 210.

The main panel area 210 may be substantially rectangular, and may include four sides 211 to 214. In the main panel area 210, edges of corner portions thereof may be rounded. The first side 211 and the third side 213 may extend in the first direction x, and the second side 212 and the fourth side 214 may extend in the second direction y. The first to fourth sub-panel areas 221 to 224 may be regions that may be bent at a predetermined curvature with respect to the main panel area 210. The first to fourth sides 211 to 214 of the main panel area 210 may be reference lines for bending the first to fourth sub-panel areas 221 to 224 with respect to the main panel area 210. The first to fourth sides 211 to 214 of the main panel area 210 may be bending start lines of the first to fourth sub-panel areas 221 to 224. In other words, the first to fourth sides 211 to 214 of the main panel area 210 may be start lines from which bending of the first to fourth sub-panel areas 221 to 224 may be initiated.

The first to fourth sub-window portions 121 to 124 of the window 10 and the first to fourth sub-panel areas 221 to 224 of the display panel 20 may be bent. The first sub-window portion 121 may be bent based on a bending axis that may be parallel to the first side 111. The second sub-window portion 122 may be bent based on a bending axis that may be parallel to the second side 112. The third sub-window portion 123 may be bent based on a bending axis that may be parallel to the third side 113. The fourth sub-window portion 124 may be bent based on a bending axis that may be parallel to the fourth side 114. The first sub-panel area 221 may bent based on a bending axis that may be parallel to the first side 211. The second sub-panel area 222 may be bent based on a bending axis that may be parallel to the second side 212. The third sub-panel area 223 may be bent based on a bending axis that may be parallel to the third side 213. The fourth sub-panel area 224 may be bent based on a bending axis that may be parallel to the fourth side 214.

The bending axis of the first sub-window portion 121 and the bending axis of the first sub-panel area 221 may be the same. The bending axis of the second sub-window portion 122 and the bending axis of the second sub-panel area 222 may be the same. The bending axis of the third sub-window portion 123 and the bending axis of the third sub-panel area 223 may be the same. The bending axis of the fourth sub-window portion 124 and the bending axis of the fourth sub-panel area 224 may be the same. The first to fourth sides 111 to 114 of the main window portion 110 may overlap or face the first to fourth sides 211 to 214 of the main panel area 210, and they may be matched, so as to coincide, when viewed from the front. The non-display area NA disposed at an edge or edges of the display panel 20 may not be visible, or hardly visible, at the front of the display device 1 since the first to fourth sub-panel areas 221 to 224 of the display panel 20 may be bent.

The window 10 includes a flat area FA that may not be bent toward an inside of the first to fourth sides 111 to 114 of the main window portion 110. A bending area BA that may corresponds to the first to fourth sub-window portions 121 to 124 may be disposed outside of the first to fourth sides 111 to 114 of the main window portion 110. Similarly, the display panel 20 may include a flat area FA that may not be bent toward an inside of the first to fourth sides 211 to 214 of the main panel area 210. A bending area BA that may correspond to the first to fourth sub-panel areas may be disposed outside of the first to fourth sides 211 to 214 of the main panel area 210.

An area other the non-display area NA, i.e., an area or areas near the edges in the first to fourth sub-panel areas 221 to 224 of the display panel 20, may represent or be included as portions of the display area DA. Therefore, the display area DA of the display panel 20 may include a flat display area FDA corresponding to the main panel area 210 and a bending display area BDA corresponding to the first to fourth sub-panel areas 221 to 224. The flat display area FDA and the bending display area BDA may be continuous so as to not include a non-display area therebetween.

The first to fourth sub-window portions 121 to 124 may be curved entirely. However, portions of the first to fourth sub-window portions 121 to 124 adjacent to the first to fourth sides 111 to 114 may be curved, while portions thereof away from the first to fourth sides 111 to 114 may be flat. The first to fourth sub-panel areas 221 to 224 may be curved entirely. However, portions of the first to fourth sub-panel areas 221 to 224 adjacent to the first to fourth sides 211 to 214 may be curved, while portions thereof away from the first to fourth sides 211 to 214 may be flat.

The display panel 20 may be attached to the window 10 once the first to fourth sub-window portions 121 to 124 of the window 10 may be bent. In a case that the display panel 20 may attached to the window 10, the first to fourth sub-panel areas 221 to 224 of the display panel 20 may already be bent. Thus, the display panel 20 may be bonded to the window 10 in a state in which the first to fourth sub-panel areas 221 to 224 may be bent to match bending of the first to fourth sub-window portions 121 to 124 of the window 10.

Since the first to fourth sub-panel areas 221 to 224 of the display panel 20 may be bent, stress on the first to fourth sub-panel areas 221 to 224 may increase. In a case that the stress may increase, a crack may occur in the display panel 20. The crack may likely occur in an inorganic insulating layer having a large modulus and high brittleness among the various layers that may be included in the first to fourth sub-panel areas 221 to 224 of the display panel 20, and the crack may also occur in layers which may not be the inorganic insulating layer, or otherwise in a wire. The stress may be further increased in an area adjacent to the first to fourth sides 211 to 214 along the bending starting line, and therefore, the area adjacent to the first to fourth sides 211 to 214 may likely be cracked. Since the stress may increase in the bending display area BDA, the crack may occur in all portions of the first to fourth sub-panel areas 221 to 224. Therefore, since a crack may occur in the bending display area BDA, an element for detecting the crack in the bending display area BDA may be obtained to avoid defects in operability of the display device.

Figure 3:
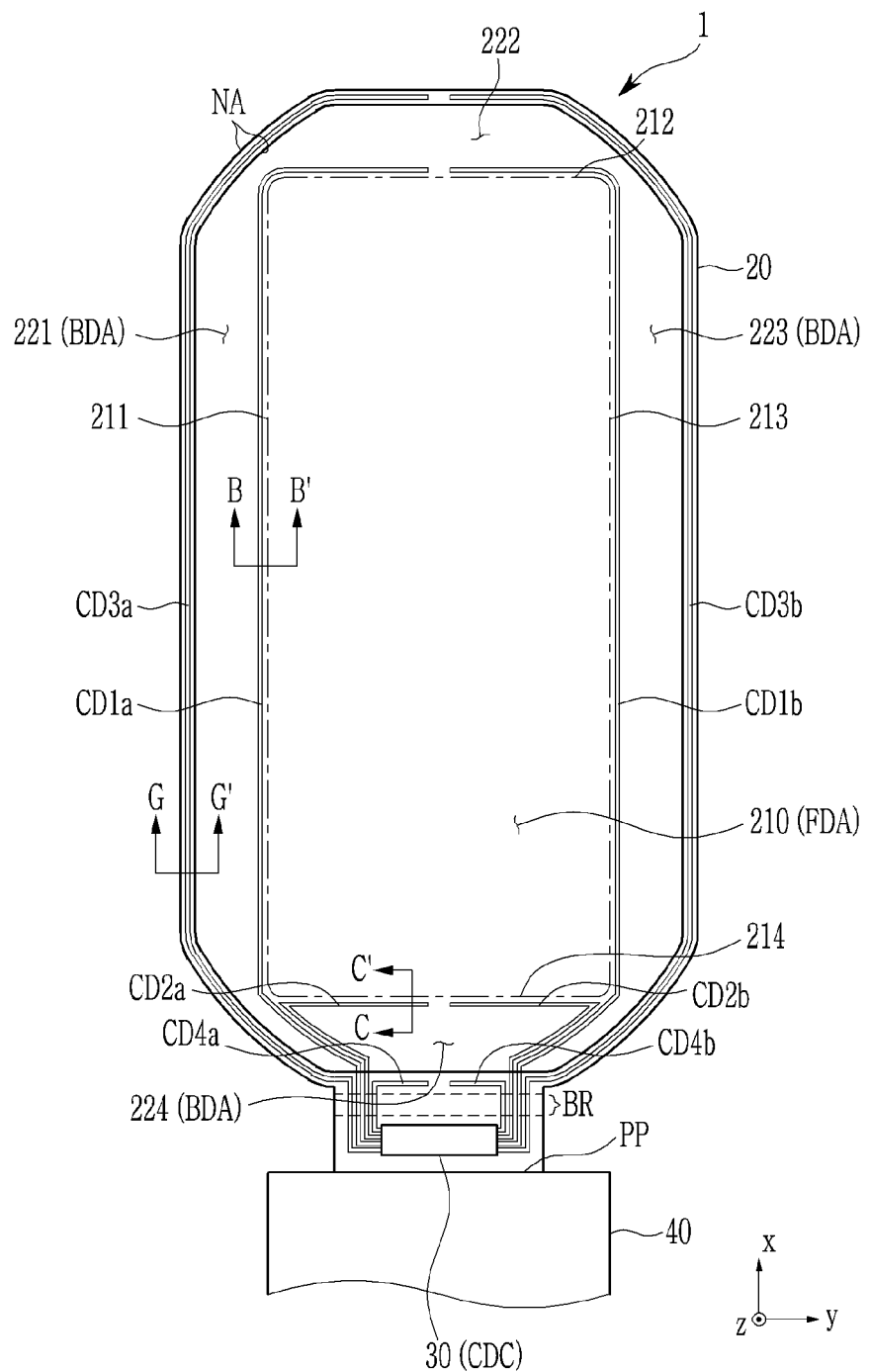
FIG. 3 illustrates a top plan view of a display device according to an embodiment.
Figure 4:
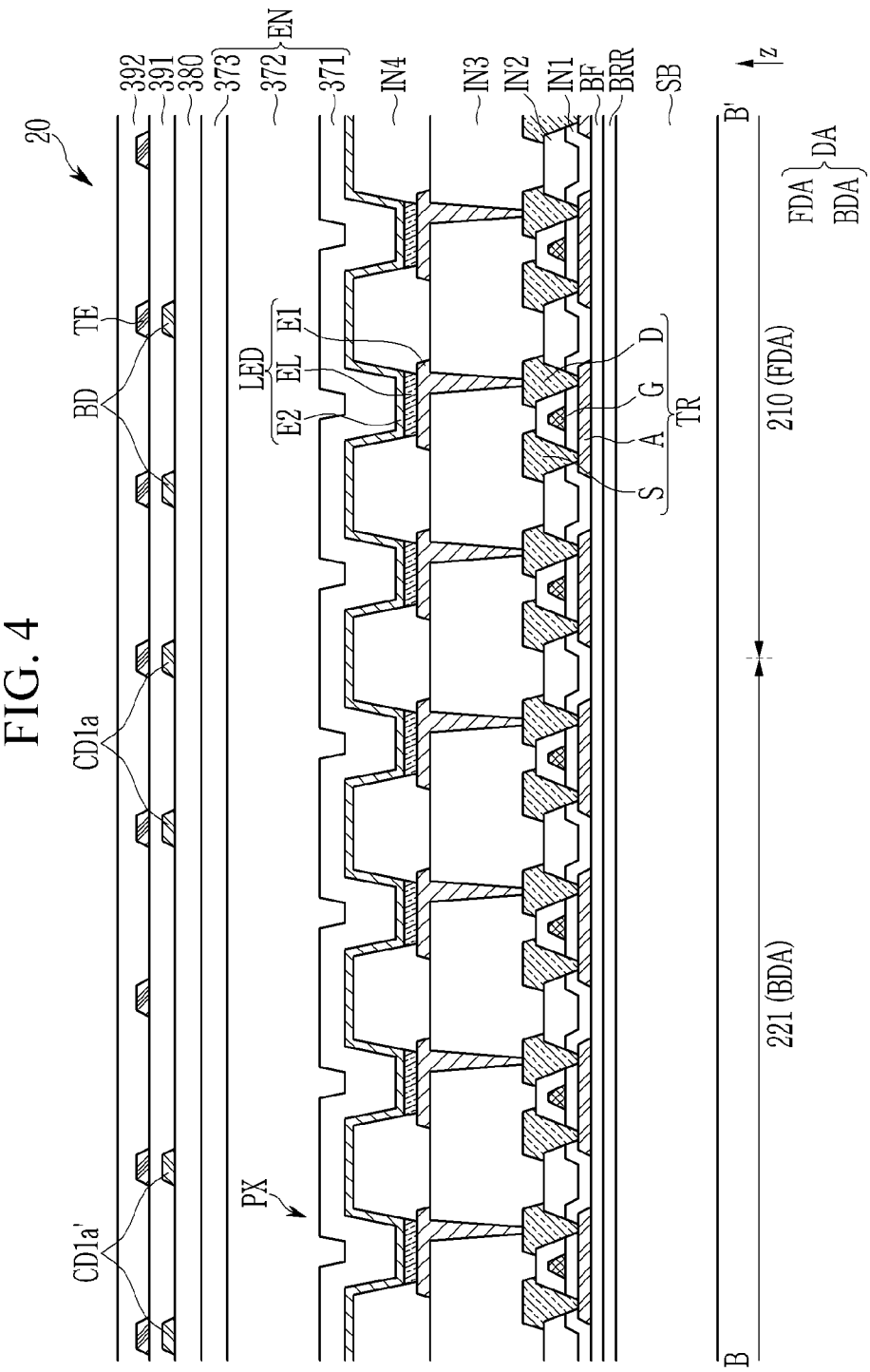
FIG. 4 illustrates a schematic cross-sectional view taken along line B-B' in FIG. 3.
Figure 5:
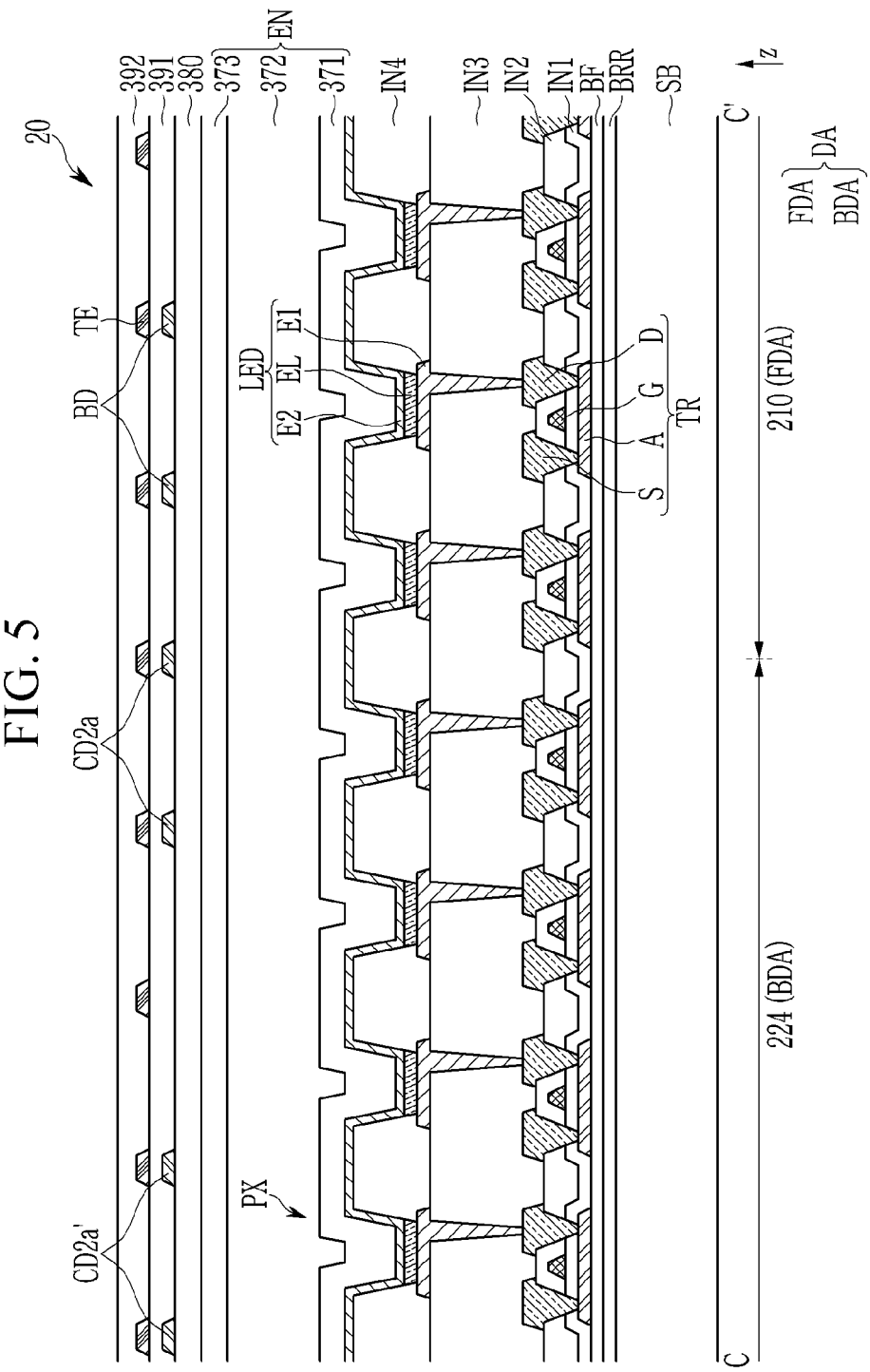
FIG. 5 illustrates a schematic cross-sectional view taken along line C-C' in FIG. 3.

FIG. 3 illustrates a top plan view of the display device 1 according to the embodiment, FIG. 4 illustrates a schematic cross-sectional view taken along line B-B' in FIG. 3, and FIG. 5 illustrates a schematic cross-sectional view taken along line C-C' in FIG. 3. FIG. 3 shows a state before the display panel 20 may be bent and before it is bonded to the window 10 of the display device 1 shown in FIG. 1 and FIG. 2.

Referring to FIG. 3, the display device 1 may include the display panel 20, an integrated circuit chip 30 disposed in the non-display area NA of the display panel 20, and a flexible printed circuit film 40 bonded to a pad portion PP of the non-display area NA of the display panel 20. The integrated circuit chip 30 may be mounted on the flexible printed circuit film 40, and may be electrically connected to the display panel 20.

The display device 1 may include a driving unit that may be disposed in the non-display area NA of the display panel 20. The driving unit may generate and/or process various signals for driving the display panel 20. The driving unit may include a data driver for applying a data signal to the data lines, a gate driver for applying a gate signal to the gate lines, and a signal controller for controlling the data driver and the gate driver. The gate driver may be integrated in the non-display area NA of the display panel 20. The data driver and the signal controller may be embodied by the integrated circuit chip 30. The display panel 20 may include a bending portion BR between the fourth sub-panel area 224 and the pad portion PP. The bending portion BR may be disposed in the non-display area NA. The bending portion BR may be bent such that the integrated circuit chip 30 and the flexible printed circuit film 40 may be disposed on a back surface of the display panel 20.

The display panel 20 may include crack detection lines for detecting a crack that may occur in the display panel 20. The crack detection lines may include first crack detection lines CD and CD1*b*, second crack detection lines CD2*a* and CD2*b*, third crack detection lines CD3*a* and CD3*b*, and fourth crack detection lines CD4*a* and CD4*b*, which may correspond to their respectively provided locations. Each of the crack detection lines CD1*a*, CD1*b*, CD2*a*, CD2*b*, CD3*a*, CD3*b*, CD4*a*, and CD4*b* may be configured in a form of a loop in which opposite ends may be electrically connected to a crack detecting circuit portion CDC. The integrated circuit chip 30 may include the crack detecting circuit section CDC, and each of the crack detection lines CD1*a*, CD1*b*, CD2*a*, CD2*b*, CD3*a*, CD3*b*, CD4*a*, and CD4*b* may be electrically connected to the integrated circuit chip 30. One end of at least one of the crack detection lines CD1*a*, CD1*b*, CD2*a*, CD2*b*, CD3*a*, CD3*b*, CD4*a*, and CD4*b* may be electrically connected to the pad portion PP, and another end thereof may be electrically connected to the integrated circuit chip 30. In another example, the crack detecting circuit portion CDC may not be integrated in the integrated circuit chip 30, but may be separately disposed.

The crack detecting circuit portion CDC may apply a signal to the crack detection lines CD1*a*, CD1*b*, CD2*a*, CD2*b*, CD3*a*, CD3*b*, CD4*a*, and CD4*b*, and may receive a signal outputted from the crack detection lines CD1*a*, CD1*b*, CD2*a*, CD2*b*, CD3*a*, CD3*b*, CD4*a*, and CD4*b* to detect whether a crack has occurred. In a case that a crack may occur at a position where a crack detection line may be disposed, the crack detection line may be broken or resistance may increase. Therefore, in a case that the crack detecting circuit portion CDC may not receive an output signal of the crack detection line or may receive only a slight output signal, the crack detecting circuit portion CDC may detect that a crack may have occurred in a region in which the crack detection line may be disposed.

The first crack detection lines CD1*a* and CD1*b*, which may assist in detecting a crack generated in the bending display area BDA of the first to third sub-panel areas 221 to 223, may be disposed in the first to third sub-panel areas 221 to 223. The first crack detection lines CD1*a* and CD1*b* may include portions disposed in the fourth sub-panel area 224 for electrical connection with the crack detecting circuit portion CDC. The portions of the first crack detection lines CD1*a* and CD1*b* disposed in the fourth sub-panel area 224 may be disposed in the bending display area BDA or may be disposed in the non-display area NA. The first crack detection lines CD1*a* and CD1*b* may include portions overlapping or facing the first to third sides 211 to 213 of the main panel area 210, which may represent bending start lines.

The first crack detection lines CD1*a* and CD1*b* may include a first crack detection line CD1*a* disposed at a left side of a substantial center of the display panel 20 and a first crack detection line CD1*b* disposed at a right side thereof so as to confirm whether the crack has occurred in the left area or the right area of the display panel 20. The first crack detection line CD1*a* and the first crack detection line CD1*b* may be apart from the second sub-panel area 222.

The second crack detection lines CD2*a* and CD2*b*, which may assist in detecting a crack generated in the bending display area BDA of the fourth sub-panel area 224, may be mainly disposed in the fourth sub-panel area 224. The second crack detection lines CD2*a* and CD2*b* may include portions overlapping or facing the fourth side 214 of the main panel area 210, which may represent a bending start line.

The second crack detection lines CD2*a* and CD2*b* may include a second crack detection line CD2*a* disposed at a left side of a substantial center of the display panel 20 and a second crack detection line CD2*b* disposed at a right side thereof, for similar reasons as discussed above with respect to the first crack detection lines CD1*a* and CD1*b*. The second crack detection line CD2*a* and the second crack detection line CD2*b* may be apart from the fourth sub-panel area 224.

Accordingly, a crack occurring in the bending display area BDA of the first to fourth sub-panel areas 221 to 224 may be detected.

The third crack detection lines CD3*a* and CD3*b*, which may assist in detecting a crack occurring in the non-display area NA, may be disposed in the non-display area NA. Therefore, the third crack detection lines CD3*a* and CD3*b* may be disposed in the first to fourth sub-panel areas 221 to 224, and may also be disposed in the non-display area NA along an edge of the display panel 20 instead of being in the bending display area BDA. The third crack detection lines CD3*a* and CD3*b* may include a third crack detection line CD3*a* disposed at a left side of the substantial center of the display panel 20 and a third crack detection line CD3*b* disposed at a right side thereof. The third crack detection line CD3*a* and the third crack detection line CD3*b* may be apart from the second sub-panel area 222.

The fourth crack detection lines CD4*a* and CD4*b*, which may assist in detecting a crack occurring between the fourth sub-panel area 224 and the pad part PP, i.e., in the bending portion BR and in the vicinity of the bending portion BR, may be disposed in the area NA. The fourth crack detection lines CD4*a* and CD4*b* may include a portion substantially extending in the first direction x and a portion substantially extending in the second direction y. The portion substantially extending in the second direction y may be disposed between the fourth sub-panel area 224 and the bending portion BR, and in the bending portion BR. The fourth crack detection lines CD4*a* and CD4*b* may include a fourth crack detection line CD4*a* disposed at a left side of the substantial center of the display panel 20 and a fourth crack detection line CD4*b* disposed at a right side thereof.

Accordingly, a crack occurring in the non-display area NA of the display panel 20 may be detected.

In order to more accurately detect a crack occurrence area, the display panel 20 includes two or more first crack detection lines CD1*a* and CD1*b*, two or more second crack detection lines CD2*a* and CD2*b*, two or more third crack detection lines CD3*a* and CD3*b*, and two or more fourth crack detection lines CD4*a* and CD4*b*.

Positions of the crack detection lines and a schematic cross-sectional structure of the display panel 20 follows below with reference to FIG. 4 and FIG. 5. A schematic cross-sectional structure of a right area of the display panel 20 may be symmetrical with the shown schematic cross-sectional structure of the left area thereof.

The display panel 20 may include a substrate SB, and various layers, wires, and elements formed on the substrate SB.

The substrate SB may be a flexible substrate, and may be made of a polymer such as a polyimide, a polyamide, a polycarbonate, or a polyethylene terephthalate.

A barrier layer BRR for preventing penetration of moisture or the like may be disposed on the substrate SB. The barrier layer BRR may be made of an inorganic insulating material such as a silicon oxide ($SiO_x$) and a silicon nitride ($SiN_x$).

A buffer layer BF may be disposed on the barrier layer BRR. The buffer layer BF may serve to block impurities diffused from the substrate SB to a semiconductor layer (A) in a process of forming the semiconductor layer (A), and to reduce a stress that may be applied to the substrate SB. The buffer layer BF may include an inorganic insulating material such as a silicon oxide or a silicon nitride.

The semiconductor layer (A) may be disposed on the buffer layer BF. The semiconductor layer (A) may include a channel region overlapping a gate electrode G, and source and drain regions at opposite sides of the channel region. The semiconductor layer (A) may include polycrystalline silicon, amorphous silicon, or an oxide semiconductor.

A first insulating layer IN1 including an inorganic insulating material such as a silicon oxide or a silicon nitride may be disposed on the semiconductor layer (A). The first insulating layer IN1 may be a gate insulating layer.

A gate conductor including a gate line and the gate electrode G may be disposed on the first insulating layer IN1. The gate conductor may include a metal such as molybdenum (Mo), copper (Cu), aluminum (Al), silver (Ag), chromium (Cr), tantalum (Ta), titanium (Ti), or the like A second insulating layer IN2 may be disposed on the first insulating layer IN1 and the gate conductor. The second insulating layer IN2 may include an inorganic insulating material such as a silicon oxide or a silicon nitride. The second insulating layer IN2 may be an interlayer insulating layer.

A data conductor including a data line, a source electrode S, and a drain electrode D may be disposed on the second insulating layer IN2. The source electrode S and the drain electrode D may be connected to the source region and the drain region of the semiconductor layer (A) through contact holes formed in the second insulating layer IN2 and the first insulating layer IN1, respectively. The data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta). The source electrode S and the drain electrode D together with the gate electrode G and the semiconductor layer (A) may form a transistor TR.

A third insulating layer IN3 may be disposed on the second insulating layer IN2 and the data conductor. The third insulating layer IN3 may include an organic insulating material such as a polyimide, an acryl-based polymer, or a siloxane-based polymer.

A first electrode E1 of a light emitting diode (LED) may be disposed on the third insulating layer IN3. The first electrode E1 may be connected to the drain electrode D through a contact hole formed in the third insulating layer IN3. The first electrode E1 may include a metal such as Ag, Ni, Au, Pt, Al, Cu, AlNd, and AlNiLa. The first electrode E1 may include a transparent conductive material such as an indium tin oxide (ITO) and an indium zinc oxide (IZO). The first electrode E1 may be a multilayer such as ITO/Ag/ITO and ITO/Al.

A fourth insulating layer IN4 may have an opening overlapping or facing the first electrode E1 and may be disposed on the third insulating layer IN3. The opening of the fourth insulating layer IN4 may define each pixel area, and may be a pixel defining layer. The fourth insulating layer IN4 may include an organic insulating material.

A light emitting layer EL may be disposed on the first electrode E1, and a second electrode E2 may be disposed on the light emitting layer EL. The second electrode E2 may have a light transmissive characteristic by forming a thin layer of a metal having a low work function such as calcium (Ca), barium (Ba), magnesium (Mg), aluminum (Al), and silver (Ag). The second electrode E2 may include a transparent conductive material such as an ITO or IZO. The first electrode E1, the light emitting layer EL, and the second electrode E2 of each pixel PX may form a light emitting diode (LED) such as an organic light emitting diode. One of the first electrode E1 and the second electrode E2 may be a cathode, and the other thereof may be an anode. The light emitting diode (LED) corresponding to the pixel PX may be disposed not only in the flat display area FDA, but may also be disposed in the bending display area BDA.

An encapsulating layer EN may be disposed on the second electrode E2. The encapsulating layer En may encapsulate the light emitting diode (LED) to prevent moisture or oxygen from penetrating from the outside. The encapsulating layer EN may be a thin-film encapsulating layer including a first inorganic layer 371, an organic layer 372, and a second inorganic layer 373. The first inorganic layer 371 and the second inorganic layer 373 may include an inorganic insulating material such as a silicon nitride, a silicon oxide, and an aluminum oxide ($AlO_x$). The organic layer 372 may include an acrylic resin, a methacrylic resin, polyisoprene, a vinyl-based resin, an epoxy-based resin, a urethane-based resin, a cellulose-based resin, a perylene-based resin, or the like.

A buffer layer 380, which may include an inorganic insulating material such as a silicon nitride and a silicon oxide, may be disposed on the encapsulating layer EN. The buffer layer 380 may be omitted.

A touch sensor unit may be disposed on the buffer layer 380. The touch sensor unit may include a first conductor, a first insulating layer 391, a second conductor, and a second insulating layer 392 that may be sequentially disposed on the buffer layer 380. The first insulating layer 391 may electrically insulate the first conductor and the second conductor, and the second insulating layer 392 may cover the second conductor to protect the second conductor.

The first conductor and the second conductor may have a mesh configuration provided with openings overlapping or facing the pixels PX. The first conductor and the second conductor may include a metal such as aluminum (Al), copper (Cu), titanium (Ti), molybdenum (Mo), silver (Ag), chromium (Cr), and nickel (Ni). The first conductor and the second conductor may include a conductive nanomaterial such as a silver nanowire and a carbon nanotube. At least one of the first insulating layer 391 and the second insulating layer 392 may include an inorganic insulating material and/or an organic insulating material.

The first conductor may include a bridge BD, the first crack detection lines CD1a and CD1b, and the second crack detection lines CD2a and CD2b. The first conductor may further include a first crack detection line CD1a' and/or a second crack detection line CD2a'. The second conductor may include a touch electrode TE.

As described with reference to FIG. 7, the touch electrode TE may include first touch electrodes and second touch electrodes that may form a mutual sensing capacitor. The bridge BD may electrically connect the first touch electrodes or the second touch electrodes. For example, the second touch electrodes, which may be adjacent to and separated from each other, may be connected to the bridge BD through the contact holes formed in the first insulating layer 391, and may be electrically connected through the bridge BD. The first crack detection lines CD1a and CD1b and the second crack detection lines CD2a and CD2b may be formed at a position where the bridge BD may not be formed and at a position not overlapping or not facing the pixel PX. In other words, the first crack detection lines CD1a and CD1b and the second crack detection lines CD2a and CD2b may be formed at a position where the bridge BD may not be formed and may be offset from the pixel PX. The first crack detection lines CD1a and CD1b and the second crack detection lines CD2a and CD2b may be formed of the same material as the bridge BD and in a same process of forming the bridge BD. Therefore, the first crack detection lines CD1a and CD1b and the second crack detection lines CD2a and CD2b may be formed without covering the pixel PX, and without a separate formation process therefor.

In another example, the first conductor may include the touch electrode TE, and the second conductor may include the bridge BD, the first crack detection lines CD1a and CD1b, and the second crack detection lines CD2a and CD2b. An antireflection layer for reducing external light reflection may be disposed on the touch sensor unit, and the antireflection layer may include a polarizer.

Figure 6:
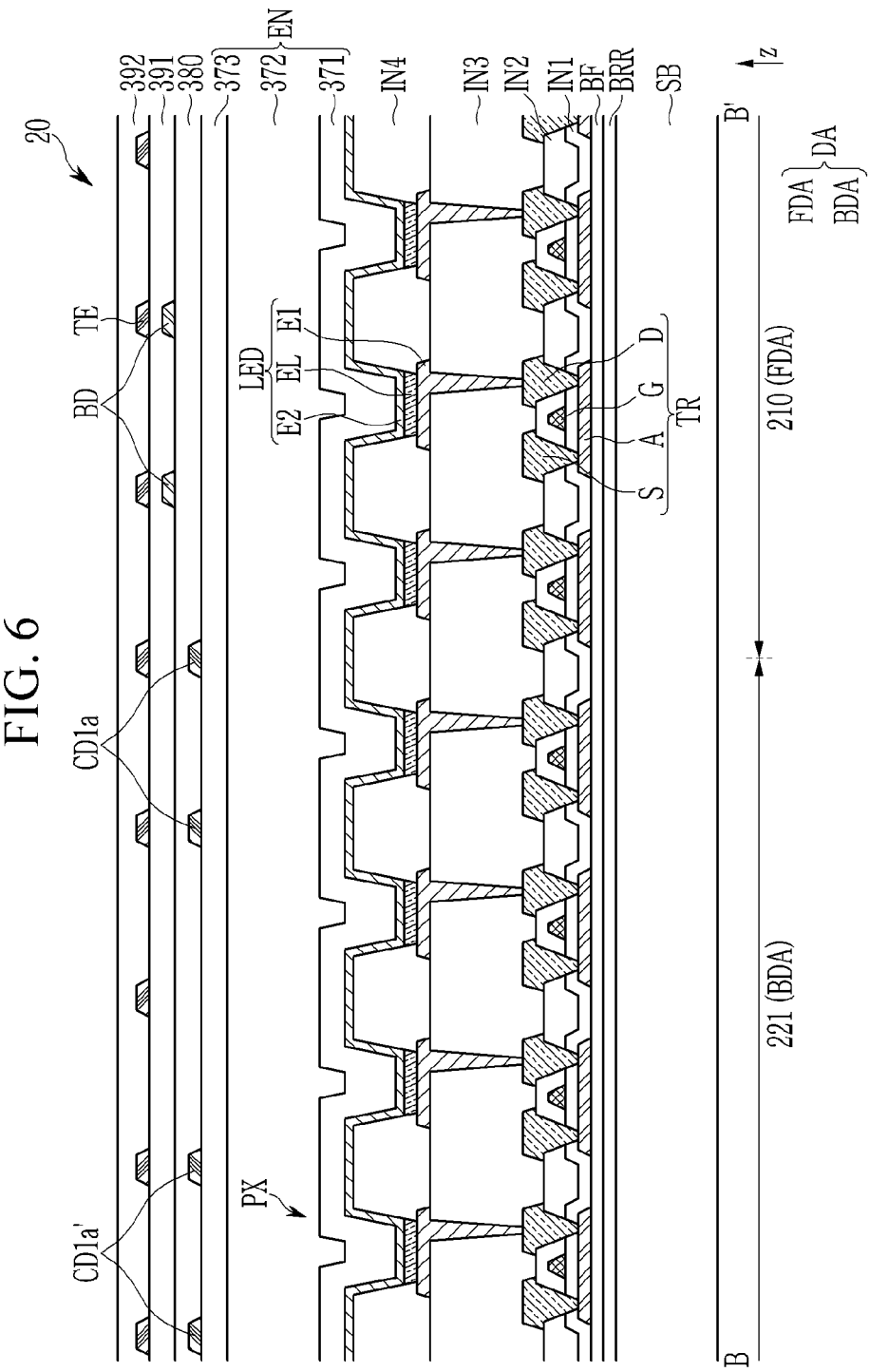
FIG. 6 illustrates a schematic cross-sectional view taken along line B-B' in FIG. 3.

FIG. 6 illustrates a schematic cross-sectional view taken along line B-B' in FIG. 3. Referring to FIG. 6, positions where the first crack detection lines CD1a and CD1b may be formed differ from those of the above-described embodiment. For example, the first crack detection lines CD1a and CD1b may be disposed between the encapsulating layer EN and the buffer layer 380. Since the first crack detection lines CD1a and CD1b may be disposed in the bending display area BDA, they may not overlap or not face the pixel PX, i.e., the first crack detection lines CD1a and CD1b may be disposed in the bending display area BDA to be offset from the pixel PX. The first crack detection line CD1a' disposed as described above may thus effectively assist in detecting a crack generated in the encapsulating layer EN and the buffer layer 380. The first crack detection lines CD1a and CD1b may include a metal such as aluminum (Al), copper (Cu), titanium (Ti), molybdenum (Mo), silver (Ag), chromium (Cr), nickel (Ni), and the like. The second crack detection lines CD2a and CD2b disposed in the fourth sub-panel area 224 may also be disposed between the encapsulating layer EN and the buffer layer 380 without overlapping or facing the pixel PX.

Figure 7:
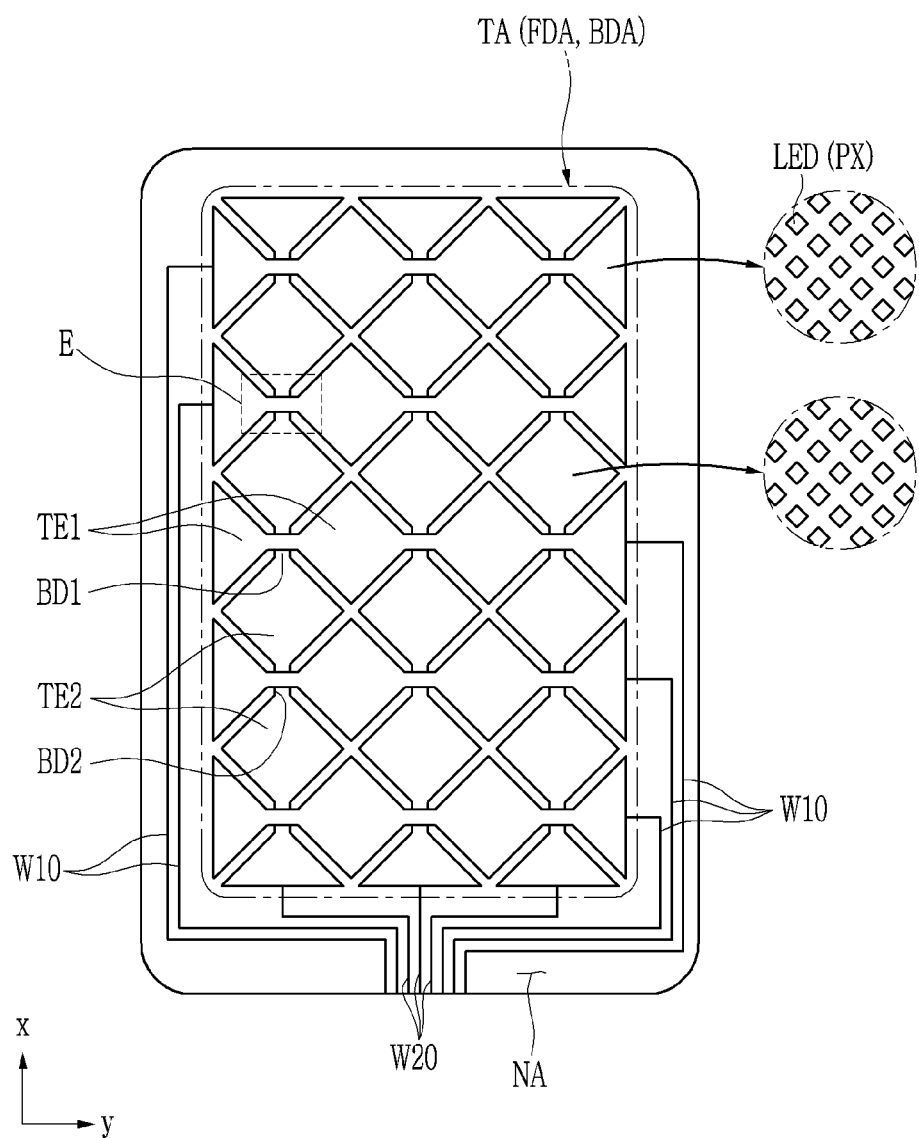
FIG. 7 illustrates a top plan view of a touch sensor unit of a display device according to an embodiment.
Figure 8:
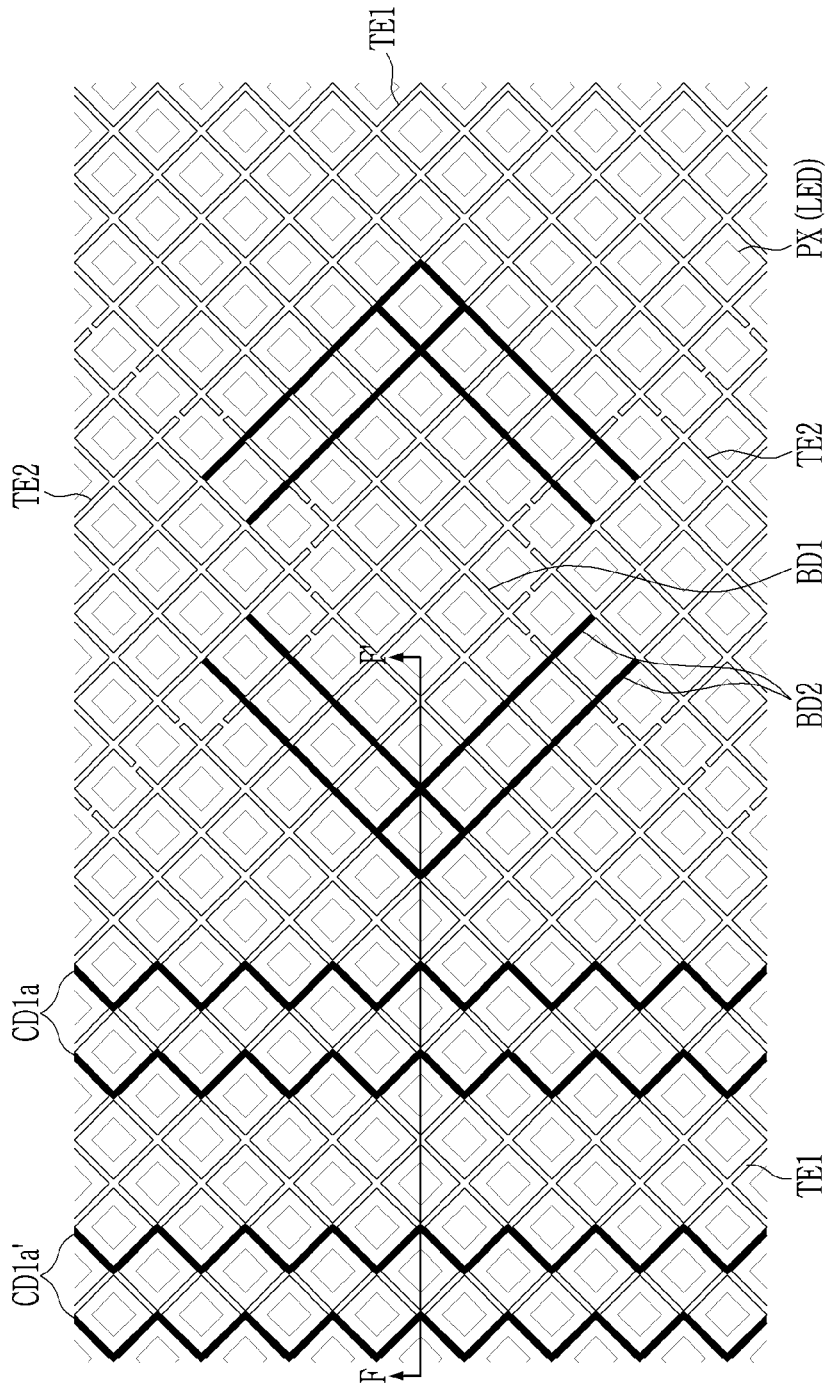
FIG. 8 illustrates an enlarged view of an area E in FIG. 7.

FIG. 7 illustrates a top plan view of a touch sensor unit included in a display device according to an embodiment, and FIG. 8 illustrates an enlarged view of an area E in FIG. 7.

Referring to FIG. 7 and FIG. 8, the touch sensor unit may include first touch electrodes TE1 and second touch electrodes TE2. The touch sensor unit may include first bridges BD1 connecting the first touch electrodes TE1 arranged in the second direction y, and second bridges BD2 connecting the second touch electrodes TE2 arranged in the first direction x. The touch sensor unit may further include first touch wires W10 connected to the first touch electrodes TE1 to transmit a signal, and second touch wires W20 connected to the second touch electrodes TE2 to transmit a signal.

The first touch electrodes TE1 and the second touch electrodes TE2 may be disposed in a touch sensing area TA. The touch sensing area TA may correspond to the display area DA including the flat display area FDA and the bending display area BDA described above, as an area capable of sensing a touch of an object. The first touch electrode TE1 and the second touch electrode TE2 may be disposed adjacent to each other form a mutual sensing capacitor to sense a capacitance change by a touch of an external object, thereby sensing touch information such as a touch, a touch position, and the like. A capacitance change signal resulting from a touch may be transmitted to a touch controller through the first touch wire W10 and/or the second touch wire W20. A dummy electrode in a floating state (not shown) may be disposed between the first touch electrode TE1 and the second touch electrode TE2.

The first touch electrode TE1 and the second touch electrode TE2 may be mesh-shaped in a configuration in which they are disposed adjacent to each other. The meshes formed by the first touch electrodes TE1 and the second touch electrodes TE2 may not overlap or not face the light emitting diode (LED) and the pixel PX so that light emitted from the light emitting diode (LED) and the pixel PX may not be covered by the first touch electrodes TE1 and the second touch electrodes TE2. In other words, the meshes formed by the first touch electrodes TE1 and the second touch electrodes TE2 may not overlap or not face the light emitting diode (LED) and the pixel PX so that they are offset from the light emitting diode (LED) and the pixel PX so that light emitted from the light emitting diode (LED) and the pixel PX may not be covered by the first touch electrodes TE1 and the second touch electrodes TE2.

The schematic cross-sectional view of the display panel 20 shown in FIG. 4 may correspond to a schematic cross-sectional view taken along line F-F' in FIG. 8. Referring to FIG. 8 and FIG. 4, the first touch electrodes TE1 and the second touch electrodes TE2 may be the second conductors that may be disposed between the first insulating layer 391 and the second insulating layer 392. The first bridge BD1 connecting the adjacent first touch electrodes TE1 may be the second conductor and may be disposed on a same layer as the first touch electrodes TE1.

The second bridge BD2 connecting the adjacent second touch electrodes TE2 may be the first conductor and may be disposed between the buffer layer 380 and the first insulating layer 391. Since the second bridge BD2 may be disposed on a different layer than the second touch electrodes TE2, which may be a second conductor, the second touch electrodes TE2 may be connected to the second bridge BD2 through the contact holes of the first insulating layer 391.

The first crack detection lines CD1a and CD1a' may be the first conductor that may be formed on a same layer and with a same material as the second bridge BD2. The first crack detection lines CD1a and CD1a' may be physically and electrically separated from the second bridge BD2. The first crack detection lines CD1a and CD1a' may overlap or face the first touch electrode TE1 and/or the second touch electrode TE2. The first crack detection lines CD and CD1a' may extend in a zigzag or alternating pattern along a line forming a mesh of the first touch electrodes TE1 and may have openings overlapping or facing the pixels PX. The first crack detection lines CD and CD1a' shown in FIG. 8 may include a portion repeatedly extending in a direction forming about −45 degrees with the first direction x and a portion repeatedly extending in a direction forming about +45 degrees with the first direction x.

In a case that the first crack detection lines CD and CD1a' may be arranged as described above, the first crack detection lines CD1a and CD1a' may be formed in the bending display area BDA without requiring a mask or separate processing step during forming of the touch sensor unit, and a crack generated in the bending display area BDA may be detected. Due to the first crack detection lines CD1a and CD1a' being formed in the bending display area BDA, a pixel PX may not be covered. Likewise, it may be unnecessary to therefore necessitate a change in a design of the touch sensor unit, for example, an arrangement of the touch electrodes TE1 and TE2 and the bridges BD1 and BD2.

In FIG. 8, the first conductor (that is, the conductor disposed between the buffer layer 380 and the first insulating layer 391 of the touch sensor unit) may be shown by a thick solid line. The first conductor may not overlap the pixel PX so as to be offset from the pixel PX, but may overlap the second conductor. For example, the second conductor may also be disposed in a region in which the first conductor may be shown in a top plan view. In another example, the first bridge BD1 may be the first conductor, and the second bridge BD2 may be the second conductor. The first touch electrode TE1 and the first bridge BD1 may be the first conductor, the second touch electrode TE2 and the second bridge BD2 may be the second conductor, or conversely, the second touch electrode TE2 and the second bridge BD2 may be the first conductor, and the first touch electrode TE1 and the first bridge BD1 may be the second conductor.

Although the first crack detection lines CD1a and CD1a' disposed in the first sub-panel area 221 of the display panel 20 have been illustrated and described above, one or more of the crack detection lines CD1a, CD1a', CD1b, CD2a, CD2a', and CD2b disposed in the bending display areas BDAs of the first to fourth sub-panel areas 221 to 224 may be disposed.

Figure 9:
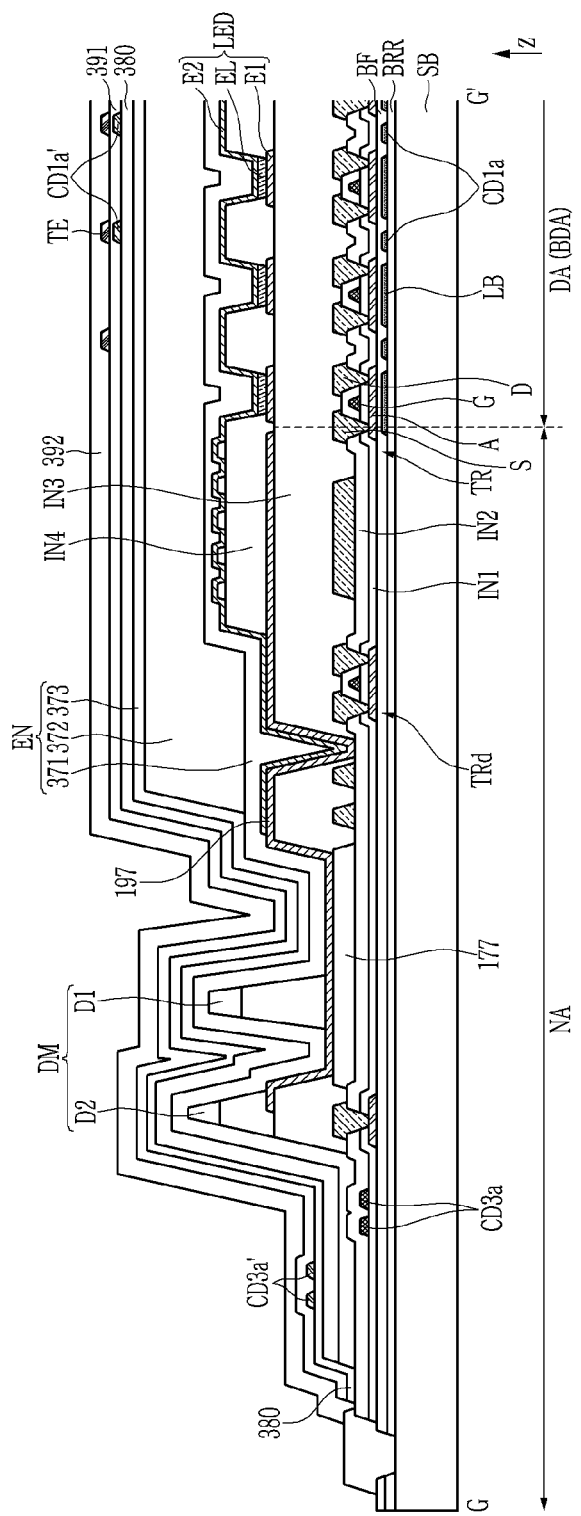
FIG. 9 illustrates a schematic cross-sectional view taken along line G-G' in FIG. 3.

FIG. 9 illustrates a schematic cross-sectional view taken along line G-G' in FIG. 3.

Referring to FIG. 9, there may be shown a schematic cross-section of the non-display area NA together with the bending display area BDA.

A light blocking layer LB overlapping or facing the semiconductor layer (A) may be disposed between the substrate SB and the buffer layer BF or between the barrier layer BRR and the buffer layer BF. The light blocking layer LB may prevent external light from reaching the semiconductor layer (A) of the transistor TR, thereby preventing deterioration of characteristics of the semiconductor layer (A). It may thus be possible to control a leakage current of the driving transistor. The light blocking layer LB may include a material that may not transmit light of a predetermined wavelength band. The light blocking layer LB may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta).

The first crack detection line CD1a may be disposed between the substrate SB and the buffer layer BF or between the barrier layer BRR and the buffer layer BF. The first crack detection line CD1a may be formed of the same material as the light blocking layer LB and in a same process of forming the light blocking layer LB. Therefore, an additional process required to form the first crack detection line CD1a may not be required. The first crack detection line CD1a disposed between the barrier layer BRR and the buffer layer BF may thus be effective in assisting the detection of a crack that may be generated in the barrier layer BRR and the buffer layer BF.

Although the first crack detection line CD1a that may be disposed in the first sub-panel area 221 has been discussed, one or more of the crack detection lines CD1a, CD1a', CD1b, CD2a, CD2a', and CD2b that may be disposed in the bending display area BDA of the first to fourth sub-panel areas 221 to 224 may likewise be disposed between the barrier layer BRR and the buffer layer BF, and may be formed of a same material as the light blocking layer LB and in a same process of forming the light blocking layer LB.

Third crack detection lines CD3a and CD3a' may be disposed in the non-display area NA. The third crack detection line CD3a may be disposed between the first insulating layer IN1 and the second insulating layer IN2, and may be formed of a same material as the gate electrode G and in the same process as that of the gate electrode G. The third crack detection line CD3a may be disposed between the second insulating layer IN2 and the first inorganic layer 371 of the encapsulating layer EN. The third crack detection line CD3a' may be disposed between the buffer layer 380 and the first insulating layer 391 of the touch sensor unit, and may be formed of a same material as the touch sensor unit and in a same process of forming the first conductor of the touch sensor unit.

The third crack detection line CD3a' may be disposed between the first insulating layer 391 and the second insulating layer 392 of the touch sensor unit.

The first crack detection line CD1a' may be disposed between the buffer layer 380 and the first insulating layer 391 of the touch sensor unit and in the bending display area BDA as described above. The first crack detection line CD1a' may thus be effective in assisting the detection of a crack that may be generated in the touch sensor unit.

A voltage transmitting line 177 for transmitting a common voltage may be disposed in the non-display area NA, and the second electrode E2 of the light emitting diode (LED) may be electrically connected to the voltage transmitting line 177 through a connecting member 197. A transistor TRd forming the gate driver may be disposed in the non-display area NA.

A dam member DM may be disposed on the second insulating layer IN2 and in the non-display area NA. The dam member DM may prevent an organic material such as a monomer from overflowing in a case that the organic layer 372 of the encapsulating layer EN may be formed. Thus, an edge of the organic layer 372 of the encapsulating layer EN may be substantially disposed inside the dam member DM. For example, such edge may be disposed between the dam member DM and the display area DA. The first inorganic layer 371 and the second inorganic layer 373 of the encapsulating layer EN may be formed so as to extend over the dam member DM. Accordingly, the contact area between the first inorganic layer 371 and the second inorganic layer 373 may be increased, so that adhesion between the first inorganic layer 371 and the second inorganic layer 373 may be increased.

The dam member DM may include a first dam D1 and a second dam D2. The first dam D1 may be disposed closer to the display area DA than the second dam D2. The second dam D2 may be formed higher than the first dam D1. The first dam D1 and the second dam D2 may include at least one layer. The first dam D1 and the second dam D2 may include a layer formed of a same material as the third insulating layer IN3 and/or the fourth insulating layer IN4 and in a same process as that of the third insulating layer IN3 and/or the fourth insulating layer IN4.

Figure 10:
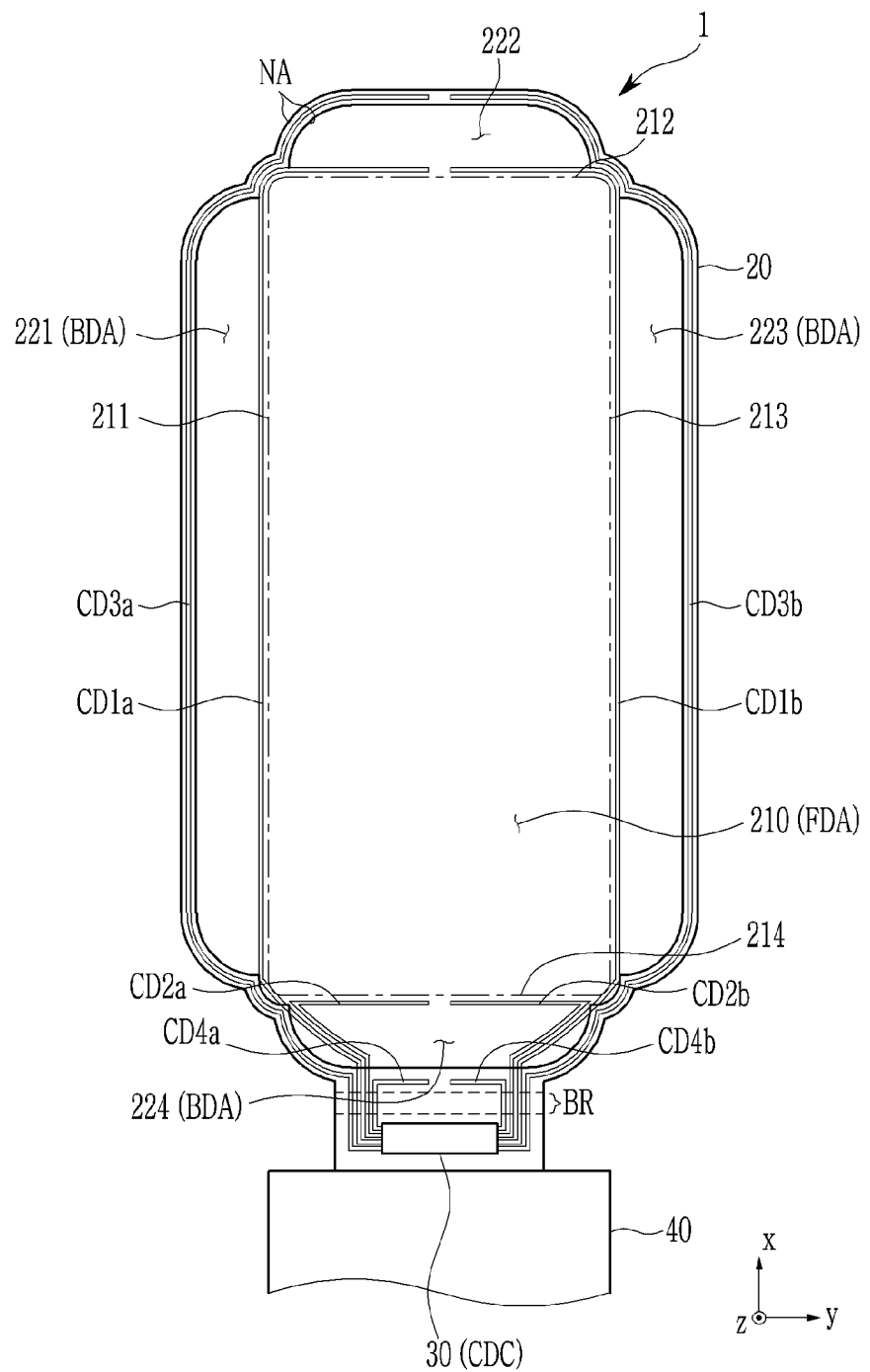
FIG. 10 illustrates a top plan view of a display device according to an embodiment.

FIG. 10 illustrates a top plan view of a display device according to an embodiment.

The display device 1 shown in FIG. 10 differs from the display device 1 shown in FIG. 3 with respect to a shape of each of four corner areas of the display panel 20. For example, a notch may be formed in a corner area of the display panel 20.

Thus, stress that may be generated in the four corner areas of the display panel 20 during the bending of the first to fourth sub-panel areas 221 to 224 of the display panel 20 may be reduced, and an effort required for bending of the same may be reduced.

As discussed, a crack may occur in the bending display area BDA due to stress during bending. Therefore, the display panel 20 may include the first crack detection lines CD1a and CD1b and the second crack detection lines CD2a and CD2b as described above, which may be disposed in the bending display area BDA, and the display device 1 may detect a crack generated in the bending display area BDA. The display panel 20 may include the third crack detection lines CD3a and CD3b and the fourth crack detection lines CD3a and CD4b disposed in the non-display area NA, and may detect a crack generated in the non-display area NA.

While the disclosure has been described in connection with the embodiments provided herein, it is to be understood that such embodiments may not be limited to their provided descriptions and illustrations, such disclosure is intended to cover various modifications and equivalent arrangements included within the spirit and scope of the appended claims.

What is claimed is:

1. A display device, comprising:
   a display panel that includes a display area including pixels and a non-display area around the display area, wherein
   the display area includes a flat display area and at least one bending display area,
   the display panel includes at least one crack detection line disposed in the at least one bending display area so as located over the pixels in side view as well as between multiple pixels in plan view,
   the display panel includes
     a substrate,
     light emitting diodes disposed on the substrate,
     an encapsulating layer covering the light emitting diodes, and
     a touch sensor unit disposed on the encapsulating layer,
   the touch sensor unit includes
   a first conductor,
     an insulating layer disposed on the first conductor, and
     a second conductor disposed on the insulating layer,
   the first conductor includes the at least one crack detection line,
   the first conductor has a mesh shape, and
   the at least one crack detection line extends in an alternating pattern along a line forming the mesh shape.

2. The display device of claim 1, further comprising:
   a crack detecting circuit portion disposed in the non-display area, wherein
   the at least one crack detection line is electrically connected to the crack detecting circuit portion such that the crack detecting circuit portion detects an existence of a crack in a case that the crack occurs at a position where a crack detection line is disposed.

3. The display device of claim 1, wherein
   the at least one bending display area includes four bending display areas respectively adjacent to four sides of the flat display area.

4. The display device of claim 3, wherein
   the at least one crack detection line includes a first crack detection line extending across three of the four bending display areas.

5. The display device of claim 3, wherein
   the display panel includes a pad portion disposed in the non-display area, and
   the at least one crack detection line includes a second crack detection line extending in a bending display area, among the four bending display areas, that is between the flat display area and the pad portion.

6. The display device of claim 1, wherein
   the at least one crack detection line is offset from the light emitting diodes.

7. The display device of claim 1, wherein
   the second conductor includes touch electrodes, and
   the first conductor includes a bridge electrically connecting adjacent ones of the touch electrodes.

8. The display device of claim 1, wherein
   the display panel further includes a buffer layer disposed between the encapsulating layer and the touch sensor unit, and
   the at least one crack detection line is disposed between the encapsulating layer and the buffer layer.

9. The display device of claim 8, wherein
   the at least one crack detection line is offset from the light emitting diodes.

10. The display device of claim 1, wherein
    the at least one crack detection line is disposed at or about a boundary separating the flat display area from the at least one bending display area.

11. The display device of claim 1, wherein the at least one crack detection line is disposed at a location that is simultaneously on and over the pixels in side view and between multiple pixels in plan view.

12. The display device of claim 1, wherein
    the display panel includes
    a transistor disposed on the substrate, and
    a light blocking layer disposed between the substrate and the transistor and overlapping a semiconductor layer of the transistor, and
    the at least one crack detection line is disposed in a same layer as the light blocking layer and comprises a same material as the light blocking layer.

13. The display device of claim 12, wherein
    the display panel further includes a buffer layer disposed between the substrate and the transistor, and
    the at least one crack detection line is disposed between the substrate and the buffer layer.

14. A display device, comprising:
    a display panel including a main panel area including a first side extending in a first direction and a second side extending in a second direction crossing the first direction,
    a first sub-panel area that contacts the first side and is bent, and
    a second sub-panel area that contacts the second side and is bent, wherein
    the first sub-panel area and the second sub-panel area include a display area and a non-display area,
    the display panel includes a crack detection line disposed in the display area, the crack detection line being located over pixels in side view as well as between multiple pixels in plan view,
    the display panel includes
    a substrate,
    light emitting diodes disposed on the substrate, an encapsulating layer covering the light emitting diodes, and a touch sensor unit disposed on the encapsulating layer, the touch sensor unit includes a first conductor, an insulating layer disposed on the first conductor, and a second conductor disposed on the insulating layer, the first conductor includes the crack detection line, the first conductor has a mesh shape, and the crack detection line extends in an alternating pattern along a line forming the mesh shape.

15. The display device of claim 14, wherein the display panel further includes a transistor disposed between the substrate, and the light emitting diode.

16. The display device of claim 15, wherein the first conductor includes a bridge, the second conductor includes touch electrodes electrically connected to each other by the bridge, and the crack detection line is disposed in a same layer as the bridge and comprises a same material as the bridge.

* * * * *